US010962609B2

(12) United States Patent
Anfiteatro et al.

(10) Patent No.: US 10,962,609 B2
(45) Date of Patent: Mar. 30, 2021

(54) CALIBRATION SYSTEM AND METHOD FOR MAGNETIC TRACKING IN VIRTUAL REALITY SYSTEMS

(71) Applicant: The Edge VR, Inc., Croton-on-Hudson, NY (US)

(72) Inventors: Adam Anfiteatro, Croton, NY (US); Steven Leo, Spring Valley, NY (US); Michael Toomas Kivisalu, Croton-on-Hudson, NY (US); Shreyas Darshan, Briarcliff Manor, NY (US); Gregory Madias, Cortlandt Manor, NY (US)

(73) Assignee: The Edge VR, Inc., Croton-on-Hudson, NY (US)

( * ) Notice: Subject to any disclaimer, the term of this patent is extended or adjusted under 35 U.S.C. 154(b) by 308 days.

(21) Appl. No.: 15/897,326

(22) Filed: Feb. 15, 2018

(65) Prior Publication Data

US 2019/0250218 A1 Aug. 15, 2019

(51) Int. Cl.
| | | |
|---|---|---|
| *G01C 9/00* | (2006.01) | |
| *G01C 17/00* | (2006.01) | |
| *G01R 33/00* | (2006.01) | |
| *G01D 5/20* | (2006.01) | |
| *G06F 3/01* | (2006.01) | |

(52) U.S. Cl.
CPC ....... *G01R 33/0035* (2013.01); *G01D 5/2006* (2013.01); *G01R 33/0029* (2013.01); *G01R 33/0017* (2013.01); *G06F 3/011* (2013.01)

(58) Field of Classification Search
CPC ............ G01R 33/0035; G01R 33/0029; G01D 5/2006; A61B 5/06; A61B 34/20; G06T 19/006; G06F 3/011; G06F 3/012; G01C 17/38

USPC ........................................................ 702/150
See application file for complete search history.

(56) References Cited

U.S. PATENT DOCUMENTS

2004/0186681 A1 * 9/2004 Harle .................... G06F 3/012
                                                   702/153

OTHER PUBLICATIONS

V. Kindratenko, "Calibration of Electromagnetic Tracking Devices", 1999, Springer-Verlag London Ltd, pp. 139-150. (Year: 1999).*

* cited by examiner

*Primary Examiner* — Michael P Nghiem
(74) *Attorney, Agent, or Firm* — Leason Ellis LLP

(57) ABSTRACT

Systems and methods are provided for calibrating electromagnetic position tracking systems commonly used in virtual reality systems by compensating for steady state magnetic field distortions that can occur within a tracking volume and distort magnetic sensor readings. The calibration system includes a calibration device that holds magnetic sensor(s) in a fixed position relative to a reference position sensor object provided on the calibration device. The calibration data collection process includes positioning the calibration device at multiple locations within a tracking volume and measuring magnetic position readings using a magnetic tracking system and a corresponding reference position using the reference position tracking system. The calibration data is then algorithmically processed using a data processor to generate a magnetic distortion correction function for adjusting the magnetic tracking system measurements based on a known position of said sensors, which is determined from the measured position of the reference tracking object.

21 Claims, 8 Drawing Sheets

CALIBRATION SYSTEM AND METHOD FOR MAGNETIC TRACKING IN VIRTUAL REALITY SYSTEMS

FIELD OF THE INVENTION

The present invention relates to virtual reality systems and, in particular, relates to object tracking systems utilized in immersive virtual reality systems. The present invention also relates to systems and methods for calibrating magnetic tracking systems for use in such virtual reality systems.

BACKGROUND OF THE INVENTION

Systems for providing immersive virtual reality ("VR") experiences rely on object tracking systems that track the position and movement of objects as they travel within a three-dimensional space, such as a playing room or field. Data-processing systems translate object movement tracked in real-space into movement of the object in a virtual reality environment ("virtual space"), graphically rendering such movement in the virtual space.

Some exemplary position tracking technologies are laser-based tracking systems and optical tracking systems, which utilize light or infra-red emitters and sensors to track objects within a given area. Laser or optical tracking systems, however, require unobstructed line-of-sight between an emitter and the tracked objects in order to accurately determine the position of the tracked object relative to the base station. As is understood by those of skill in the art, occlusions can occur in the measured position data when line of sight is lost, e.g., when a tracked object is obscured by another object.

Other popular tracking systems include magnetic position tracking systems. Such systems are not prone to occlusion problems arising in the absence of line-of-sight between the electromagnetic field transmitter(s) and the sensors placed on the tracked objects. Typical six "degree of freedom" ("DoF") electromagnetic tracking systems consist of a magnetic field transmitter and a receiver. The electromagnetic transmitter contains a plurality of orthogonal coils that can be pulsed to transmit orthogonal electromagnetic fields, whereas the receiver has three coils that measure such fields generated by the transmitter. The position of the receiver can be determined by comparing the strength of the received signals with the transmitted signals. In addition, the orientation of the receiver can be determined by comparing the strength of the received signals to each other.

Absolute position and orientation systems that rely on magnetic field emission (e.g., AC or DC-based tracking systems), however, are prone to magnetic distortion. The error in position can be drastic depending on the severity of the distortion. This error leads to unusable position information for applications that require a high degree of accuracy, but are deployed in locations that have distortions present. The method required to correct for such distortion involves recording sensor data at a highly granular number of known physical locations, and correcting the distorted sensor output at each location.

Such calibration data collection methods implement a method of physically referencing the position of the magnetic sensors manually. This manual approach, however, is prone to a large number of procedural errors in both data collection and set-up. For example, a known physical data collection method is to layout a measured grid with holes drilled or positions otherwise marked at known intervals, as shown in FIG. 5, to provide known physical reference positions at which to capture and measure magnetic sensor data. Constructing such a room-sized grid and recording magnetic calibration data can consume a significant amount of time (e.g., 45 man-hours to construct a grid and 10 man-hours for sensor data collection). Furthermore, such calibration systems are prone to error arising from the manual construction of the reference grid, as well as the manual positioning/leveling of the calibration device during data-collection. For instance, error can arise from differences between the actual position of the calibration device and the reference position determined from the manually defined reference grid, which is assumed to be accurate.

Accordingly there is a need for calibration systems and methods that compensate for the effects of steady state magnetic distortion, thereby providing a quick and accurate way to record calibration data. Improved calibration systems and methods, as well as simplified data acquisition techniques, are needed to more efficiently and more accurately calibrate electromagnetic tracking systems.

It is with respect to these and other considerations that the disclosure made herein is presented.

SUMMARY OF THE INVENTION

According to an aspect of the present invention, a method is provided for calibrating an electromagnetic position tracking system (EPTS) used to track magnetic sensor objects within a three-dimensional space. The method includes providing a calibration system including, the EPTS and a reference position tracking system (RPTS). The EPTS includes an electromagnetic field transmitter configured to transmit an electromagnetic field through the space, and a magnetic sensor object configured to detect the magnetic fields, wherein the EPTS is in data communication with a data processing computer and configured to measure the position of the magnetic sensor as a function of the magnetic fields detected by the magnetic sensor object. The RPTS includes a reference tracked object and one or more base stations, wherein the RPTS is in data communication with the data processing computer and configured to measure the position of the reference tracked object within the space using an object tracking technology that is not affected by steady state magnetic field distortions local to the space. The calibration system also includes a sensor support device having a support structure for supporting the reference tracked object and the magnetic sensor object and maintaining the reference tracked object and the magnetic sensor object in a known relative position.

The method for calibrating the EPTS also includes the step of measuring calibration data for each of a plurality of locations within the space using the calibration system. In particular, measuring calibration data is performed by iteratively positioning the sensor support device at a plurality of locations within the space and, for each location that the sensor support device is positioned, measuring a position value for the magnetic sensor object using the EPTS and measuring a reference position value for the reference tracking object using the RPTS. Furthermore, the calibration data is stored by the data processing computer in an associated non-transitory storage medium.

The method also includes the step of calculating, with the data processing computer for each location that the sensor support device is positioned, an actual position value for the magnetic sensor object as a function of the measured reference position value and the known relative position. In addition the method includes the step of generating, with the data processing computer based on the calibration data measured at each location and the corresponding calculated actual positions, a correction function. The correction function is for converting subsequently measured position values for the magnetic sensor object into an adjusted position value that accurately reflects the actual position of the magnetic sensor object and thereby compensating for position measurement errors caused by local steady state magnetic field distortions at any location within the space.

According to other aspects of the present invention, a system for calibrating an electromagnetic position tracking system (EPTS) is provided. The system comprises the EPTS that includes an electromagnetic field transmitter configured to transmit an electromagnetic field through the space, and a magnetic sensor object configured to detect the magnetic fields. Accordingly, the EPTS is configured to measure the position of the magnetic sensor object as a function of the magnetic fields detected by the magnetic sensor object.

The system further comprises a reference position tracking system (RPTS) that includes a reference tracked object and one or more base stations. In particular, the RPTS is configured to measure the position of the reference tracked object within the space using an object tracking technology that is not affected by steady state magnetic field distortions local to the space.

The system also includes a sensor support device having a support structure for supporting the reference tracked object and the magnetic sensor object thereon and for maintaining the reference tracked object and the magnetic sensor object in a known relative position.

Also included in the system is a data processing computer that is in data communication with the EPTS and RPTS. In particular, the processing computer comprises a computer readable storage medium, a communication interface, a processor in operative communication with the communication interface and the storage medium. The computer also includes a calibration software application that is stored on the storage medium and executable by the processor such that the calibration software application configures the data processing computer to coordinate operation of the RPTS and EPTS. The calibration software also configures the data processing computer to calibrate the EPTS by, for each of a plurality of locations within the space that the sensor support device is positioned, measuring a position value for the magnetic sensor object using the EPTS and measuring a reference position value for the reference tracking object using the RPTS, and storing the calibration data in the storage medium. The calibration software also configures the data processing computer to calculate, for each location, an actual position value for the magnetic sensor object as a function of the measured reference position value and the known relative position. Furthermore the calibration software also configures the data processing computer to generate, based on the calibration data measured at each location and the corresponding calculated actual positions, a correction function for converting subsequently measured position values for the magnetic sensor object into an adjusted position value that accurately reflects the actual position of the magnetic sensor object and thereby compensating for EPTS position measurement errors caused by local steady state magnetic field distortions at any location within the space.

These and other aspects, features, and advantages can be appreciated from the following description of certain embodiments of the invention and the accompanying drawing figures and claims.

DETAILED DESCRIPTION OF CERTAIN EMBODIMENTS OF THE INVENTION

Figure 1:
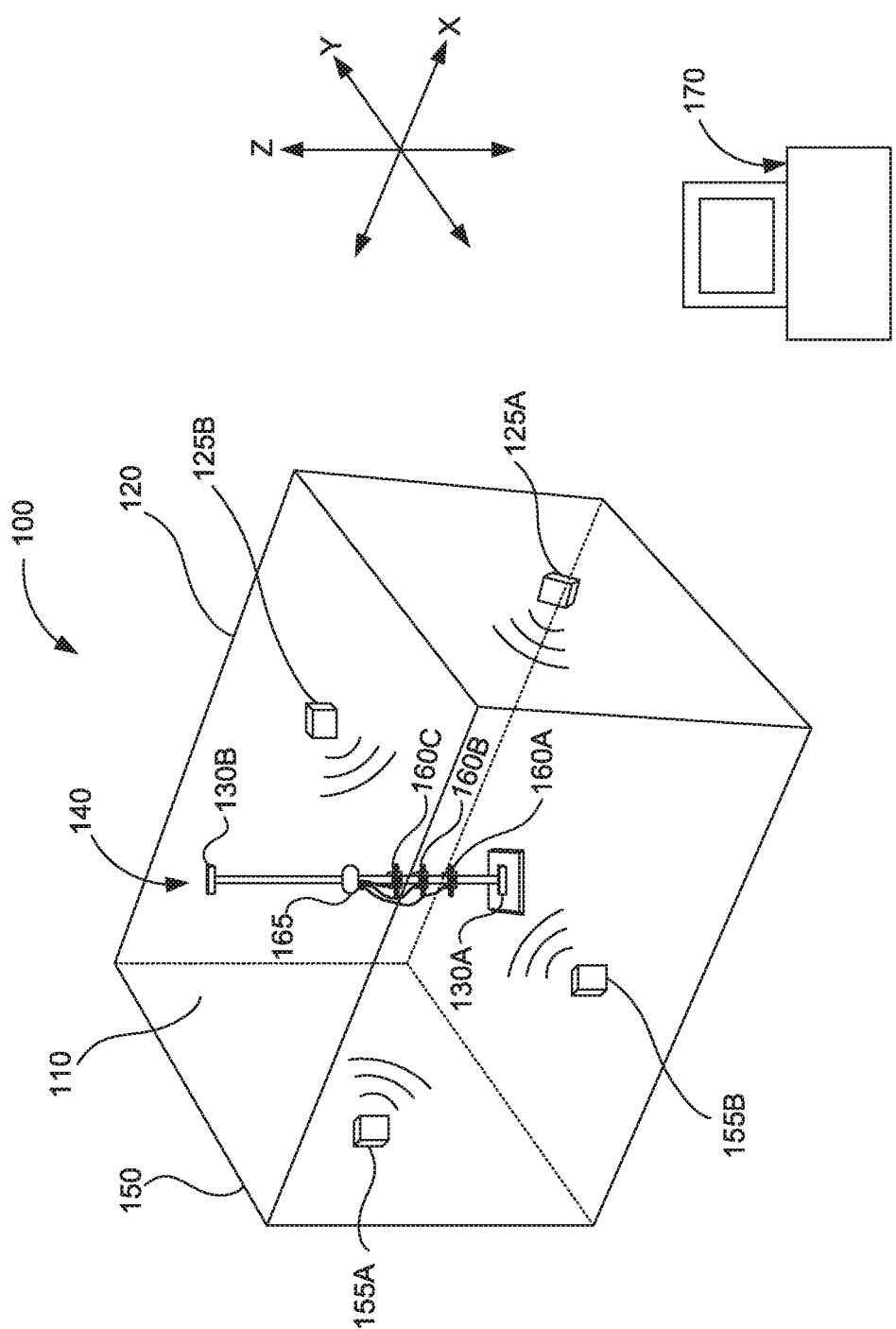
FIG. 1 is a system diagram illustrating an exemplary system for calibrating electromagnetic position tracking systems according to one embodiment of the present invention.

In one or more embodiments, systems and methods are provided for calibrating electromagnetic position tracking systems for use in VR systems. In the current VR market, there are a number of room-scale VR systems that aim to provide users with realistic immersive VR experiences by tracking objects moving about within a three-dimensional space. Using the monitored motion data, such systems graphically render an immersive virtual reality experience for output to the user, for example, via a head-mounted display ("HMD").

As would be understood by those of ordinary skill in the art, such VR systems rely on one or more tracking systems for tracking and monitoring the placement and/or movement of objects (e.g., a person, body parts, and/or objects and the like) within the volume of space that the VR system is rendering ("tracking volume"). Tracking system can utilize various technologies for determining an object's placement in and movement through three-dimensional space including, for example and without limitation, measuring the object's position and orientation and changes in such measurements. As would be understood by those in the art, position and orientation are typically measured relative to a three-dimensional reference frame for a given tracking system; the measured position and orientation values expressed in terms of a given coordinate system for the reference frame. The term "position," as used herein, is not intended to be limiting and should be understood to encompass a position of an object and/or its orientation relative to one or more reference frames and other parameters relating to the object's placement and movement in one or more dimensions, unless specified otherwise.

Position tracking systems that rely on magnetic field emission are commonly used to track objects in VR systems, however, they can be prone to local magnetic field distortions that occur within the tracking volume. These distortions can render the position measurements unsuitable for applications that require a high degree of accuracy, such as fully immersive, room-scale VR systems. Embodiments of the invention further described herein include a specialized system for calibrating the magnetic position measurements by compensating for steady state magnetic field distortions that occur within the tracking volume. According to a salient aspect, the disclosed embodiments provide an efficient and accurate solution for recording calibration data, processing such calibration data and ultimately correcting inaccurate magnetic sensor readings caused by steady state magnetic distortion.

Existing magnetic distortion correction solutions offered by manufacturers of commercially available electromagnetic tracking systems fail to achieve sufficient accuracy for room-scale VR systems. Testing results have shown that distortion correction systems and algorithms that keep the positional accuracy of a magnetic tracking system to within about eight (8) millimeters of the actual, physical position are suitable for VR applications. The exemplary calibration systems and magnetic distortion correction algorithms disclosed herein achieve such requisite accuracy, or better, thereby allowing for existing magnetic tracking systems to be effectively used in room-scale VR systems.

In accordance with one or more of the disclosed embodiments, calibration of the magnetic tracking system is performed by measuring the position of magnetic sensors at known physical locations throughout the tracking volume, comparing the magnetic sensor readings to the actual positions where the measurement are taken, and correcting errors in the magnetic sensor readings caused by steady state magnetic distortion.

More specifically, embodiments of the presently disclosed calibration system comprises a magnetic position tracking system in conjunction with a second position tracking system, referred to as the "reference position tracking system." The reference position tracking system is, preferably, not susceptible to local magnetic field distortions and is used to track the physical location of a "reference sensor object" as it moves throughout the tracking volume to a sufficient degree of accuracy. In addition, the system includes a calibration device that holds the reference sensor object and the magnetic sensor(s) in a fixed position relative to one another. For example, the calibration device can be a pole that is affixed with the reference sensor object and magnetic sensors such that the sensors are linearly aligned along the length of the pole and kept at a known position relative to one another.

The process for collecting the calibration data using embodiments of the present system generally involve positioning the calibration device at a plurality of locations within the tracking volume and, at each of the plurality of locations location, leveling the calibration device, taking magnetic sensor position readings with the magnetic tracking system and measuring a corresponding "reference position" using the reference position tracking system. As further described herein, the measured calibration data from both the magnetic tracking system and reference position tracking system are algorithmically processed to calibrate the magnetic tracking system with a suitable degree of accuracy.

According to a further salient aspect, the exemplary calibration systems and methods enable the measurement of calibration data more efficiently than existing systems and with a higher degree of accuracy. As an added benefit, the exemplary systems and methods disclosed herein uniquely adapt existing tracking systems for use in the calibration system through, inter alia, algorithms for adjusting and referencing the tracking systems' specific reference frame to a common reference frame and thereby provide a cost-effective and accurate calibration system and methodology.

FIG. 1 is a high-level system diagram illustrating an exemplary system 100 for calibrating a magnetic tracking system 150 for use in VR applications. As shown in FIG. 1, the physical environment includes a three-dimensional (3D) volume 110, references as the "tracking volume" or space, in which a user or objects can be placed and tracked as they move within such space. The system 100 also includes an electromagnetic position tracking system 150. For instance, in the exemplary implementation further described herein, the "G4" tracking system from Polhemus Corp. of Seattle Wash. may be adapted to serve as the exemplary magnetic tracking system 150, although alternative electromagnetic tracking systems are suitable.

By way of example and without limitation, the magnetic tracking system 150 is a six (6) "degree of freedom" (DoF) electromagnetic tracking system comprising one or more magnetic field transmitters 155A and 155B that are positioned outside of the tracking volume 110. The calibration aspect of magnetic tracking system 150 also includes a plurality of magnetic sensor devices 160A-160C, referred to as "magnetic sensor objects" that are monitored within the tracking volume using an associated data-processing system.

Typically, an electromagnetic transmitter 155A and 155B contains orthogonal coils that transmit orthogonal electromagnetic fields and each receiver has corresponding coils that are configured to detect and measure the fields generated by the transmitter. In addition, measured data relating to the transmitted signals and received signals can be sent from the transmitters and sensors to the data-processing computer 170 over a wired or wireless data communication connection (not shown) for further processing. For instance, the data-processing computer can be configured to determine the position of a given magnetic sensor relative to the transmitter by comparing the strength of the received signals with the transmitted signals and can determine the orientation of the given magnetic sensor by comparing the strength of the received signals to each other.

In addition, as shown in FIG. 1, the calibration system 100 also includes a reference tracking system 120 that is configured to determine a physical reference position for the magnetic sensors during the calibration process to a sufficient degree of accuracy and that is not affected by magnetic distortion. The reference tracking system 120 can comprise one or more base stations 125A and 125B and at least one reference tracking object 130A.

Various commercially available position tracking systems that are not affected by magnetic distortion can be used to track a reference tracking object 130A (e.g., measure position and orientation to a sufficient degree of accuracy) for calibration of the magnetic sensor data. In the exemplary implementation further described herein, components of the "VIVE Virtual Reality System" from HTC Corp. of Seattle Wash. can be adapted to serve as the reference tracking system 120. It should be understood, however, that alternative types of position tracking systems, not limited to "line of sight" tracking systems, can be utilized without departing from the scope of the disclosed embodiments.

By way of example and without limitation, the VIVE system uses line-of-sight, and more specifically, "time-of-flight" positioning to determine the position and orientation of tracked objects such as a VR headset or VR controller. In one exemplary implementation, the VIVE system includes two base stations (e.g., 125A and 125B) that are each configured to project a horizontal line of light and a vertical line of light using lasers, repeatedly sweeping these beams through the tracking volume 110. It should be understood that the lines are described as "horizontal" or "vertical" relative to the particular coordinate system of the VIVE base-station.

As noted, the VIVE system also includes tracked objects (e.g., tracked object 130A) that are covered in small sensors configured to detect the light emitted by the base station(s) as they pass over the tracked object. The Vive system further includes data-processing system (e.g., computing device 170) that integrates the laser transmission and detection data to determine the orientation of the tracked objects and their position in 3D space relative to the base station(s). Although the data-processing computer 170 is referred to as a stand-alone computing device that is separate from the various signal transmitting devices and sensors/receivers, it should be understood that the measuring and data-processing operations further described herein can be similarly be performed, in whole or in part, using data processors local to a base-station and/or sensor device.

As further described herein, various modifications or supplemental processes can be necessary to integrate existing systems like the VIVE-based reference tracking system 120 and/or magnetic tracking system 150 for use in the calibration system 100. Integration can include, for example and without limitation, calibrating the reference tracking system 120 according to the tracking volume. Integration can also include applying data-processing algorithms to translate measurements captured according to a specific reference frame and coordinate system associated with a given tracking system to a common reference frame and coordinate system.

Figure 2:
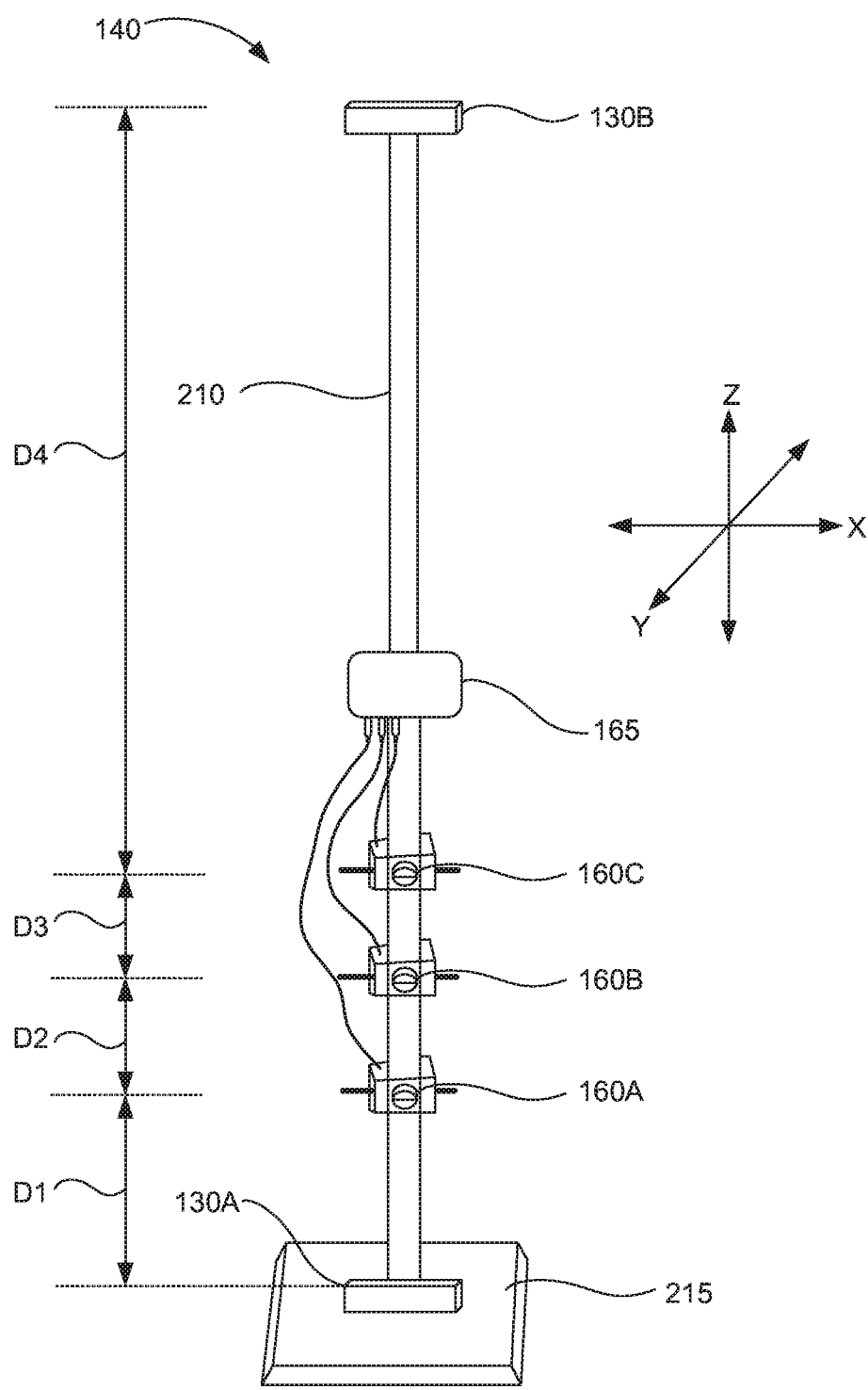
FIG. 2 is a diagram illustrating an exemplary calibration device according to one embodiment of the present invention.

In addition, as shown in FIG. 1, the calibration system 100 can also include a calibration device 140 with which the reference tracking object 130A and the magnetic sensors 160A-160C are integrated. FIG. 2 provides a close-up perspective view of the exemplary calibration device 140 in accordance with one or more of the disclosed embodiments. The calibration device 140 comprises a support structure 210 comprising a base and one or more support members that can be fitted with the various tracked objects for use in the collection of calibration data. Preferably, the tracked objects are attached to the support structure 210 using a temporary securement such that the same devices that are used during calibration are used during operation of the VR system. However, in addition or alternatively, one or more tracked objects can be permanently secured to or integrated with the calibration device.

More specifically, as shown in FIG. 1, tracked objects including magnetic sensors 160A-160C and the reference tracking object 130A can be attached to a pole-like support member 210 using an appropriate securement. In addition, the pole can be supported by a base 215 configured to maintain and stabilize the pole in the upright position when the base is placed on the floor.

By attaching the tracked objects to the support structure, the objects can be maintained in a known relative position during the calibration data collection process. For example and without limitation, as shown in FIG. 2, the reference tracking object 130A can be provided near the base of the support structure and the various tracked objects can be arranged such that they are at least generally in linear alignment along the length of the pole. Furthermore, additional sensor objects, namely, sensor object 103B, can be provided on the support structure. In one or more embodiments, the sensor object 130B can be a calibration tool (a digital leveling device) that is provided at the top of the pole-like support structure and that allows for the pole's initial position to be properly aligned at the beginning of the calibration data-collection procedure.

As would be understood, the calibration algorithm can benefit from the support structure (and the aligned sensor objects provided thereon) to be vertically aligned while calibration data is being collected to more accurately match the virtual values to the physical sensor positions on the pole. In addition, the magnetic sensors 160A-C can be positioned along the length of the pole at respective distances relative to the reference tracking object 130A and/or other of the magnetic sensors and/or the digital leveling device 130B. Although the various sensor objects are shown as generally aligned and spaced apart known distances d1-d4 in a vertical direction, which corresponds to the Z-axis in an exemplary 3D coordinate system for the physical tracking volume, it should be understood that the sensors can have different respective positions in any number of directions, say, along the X axis and/or Y axis.

As noted, in some implementations, additional sensor objects can be incorporated into the calibration device 140 including object 130B, which is shown in FIG. 2 as being positioned proximate to the top-end of the calibration device. Furthermore, as shown the leveling device 130B can be rigidly attached to the support structure such that its position relative to the structure and other sensors provided on/in the structure remains constant throughout the calibration data-collection process and thereby enables leveling of the support member in one or more directions before and/or during the collection of calibration data at various locations throughout the tracking volume.

Additional hardware devices that facilitate operation of the calibration device 140 and calibration system can be integrated with the tracking device. For example, as shown in FIG. 2, a data processing and communication unit 165 can be in wired connection with the magnetic sensors 160A-160C so as to collect and process the sensor readings and transmit the information to a data-processing computer 170 (not shown).

Figure 3A:
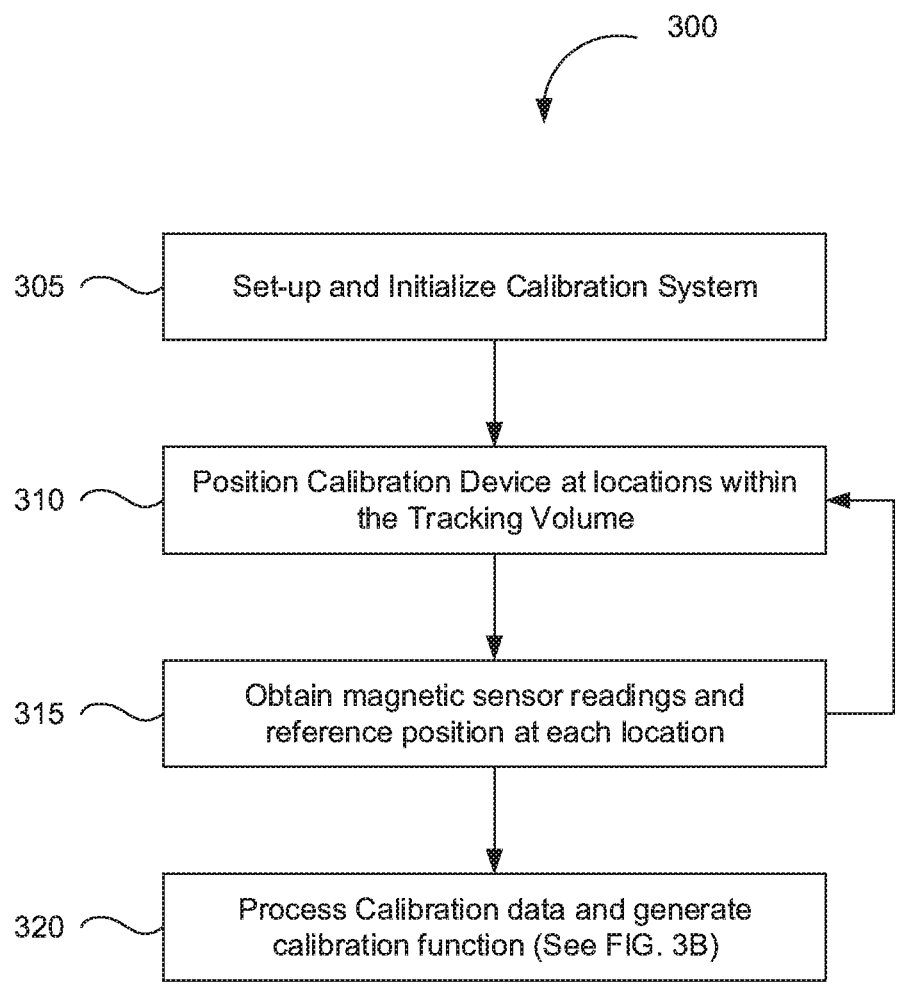
FIG. 3A is a flow chart of a method for calibrating electromagnetic tracking systems by collecting location data according to one embodiment of the present invention.

As a non-limiting practical example, the exemplary methods for calibrating a magnetic tracking system using the calibration system 100 are further described herein with continued reference to the FIGS. 1 and 2. FIG. 3 is a high-level flow diagram illustrating an exemplary routine 300 for recording calibration data using the calibration system 100 according to embodiments of the invention.

In general, the method for correcting magnetic sensor errors caused by local magnetic field distortion involves recording magnetic sensor data at known physical locations and correcting the distorted sensor output to that location. As further described herein, the particular method used to define the known physical locations of the magnetic sensors during the calibration process involves providing a positionally tracked object on the calibration device 140, namely, the reference tracking object 130A, with a known relative distance between it and the physical locations of the magnetic sensors, which are also provided on the calibration device.

In an exemplary practical implementation described herein, a Vive-based reference tracking system 120 is used and the Vive controller/tracker is the reference tracking object 130A used to provide the positional reference for the magnetic tracking sensors 160A-160C, which are G4 magnetic tracking sensors, for example. More specifically, the Vive controller/tracker is tracked by the Vive system's base stations to provide relative positional data against which the magnetic sensors can be calibrated. As further described herein, in order to use the Vive controller/tracker as a reference for the G4 sensors, the coordinate systems for the Vive system and the physical space are preferably aligned. As a result of the alignment process, both the G4 sensors and the Vive tracked objects exist in the same global reference frame.

Depending on the implementation, other tracking systems, such as the magnetic tracking system, can also require alignment with a global reference frame. In the particular exemplary implementation using the Polhemus G4 system, the G4 system typically has a source configuration set up file that is loaded directly into the G4 hub (object 165) and contains the locations of the various sources relative to a desired origin, wherein the G4 system's origin (e.g., the (0,0,0) point) is accepted to be in line with the defined world origin. Accordingly, in this exemplary implementation, the G4 magnetic tracking system and the physical space do not need to be separately aligned.

Thereafter, the Vive tracked object is calibrated and mapping can begin. With the Vive tracked object calibrated to the physical locations of the G4 sensors, the user can walk anywhere within the specified tracking volume and the data-processing computer, which executes a custom software application that coordinates operation the reference tracking and magnetic tracking systems, records calibration data-points measured by the respective tracking systems. Furthermore, as further described herein, when measuring a data point, the projected true sensor positions and the distorted positions can be recorded for use in the correction algorithm. More specifically, the "projected true sensor positions" are the virtual positions of respective sensors measured using the tracked object 130A once the initial calibration is completed. These represent the true physical locations of the magnetically tracked sensors determined using the calibration software and can be recorded along with the distorted magnetic sensor data-points for comparison.

As noted, generally, the routine 300 for collecting the calibration data involves setting up and initializing the calibration system 100, step 305. More specifically, step 305 can include affixing the magnetic sensors 160A-160C and reference tracking object(s) 130A to the calibration device support structure 210, as well as activating the magnetic tracking system 150, the reference position tracking system 120 and the data-processing computer 170 that coordinates operation of the calibration system 100.

Initialization at step 305 can also include the step of aligning the coordinate systems/reference frames of one or more of the tracking systems to a global physical reference frame, which is the reference frame that corresponds to the physical 3D tracking space. Such value is used as a common reference frame in which the data processing computer 170 can process and analyze calibration data captured using respective tracking systems. For instance, use of the Vive-based system as the reference position tracking system 120 can benefit from aligning the Vive system's particular reference frame with the global physical reference frame because the "virtual" reference frame that the Vive utilizes can differ from the global physical reference frame. For example, the mentioned reference frame is the coordinate system in which the Vive system calculates the position of the various Vive tracked objects (e.g., object 130A). This coordinate system, though consistent for a virtual experience, it is known to change the origin reference periodically independent of the global reference frame. As an example, a value reading (1,1,1) in the Vive reference frame can actually be at the position (2,2,2) in the global reference frame. Furthermore, the Vive system does not independently handle overlaying its reference frame with a different global physical reference frame. Accordingly, the data processing computer 170 can be configured to generate and apply a translation solution that enables overlaying two disparate reference frames, as well as conversion of data obtained according to one reference frame to another particular reference frame used for subsequent computations.

In some embodiments, the process for defining the translation solution includes placing a first reference tracking object (e.g., object 130A) at one or more known physical location(s) in the tracking volume and measuring the position and orientation of the tracking object. The measuring of the virtual position/orientation using the reference position tracking system 120 can be performed using two Vive tracked objects, wherein one is a reference for the origin and the other is an orientation reference. Based on a known relative position and orientation of the two reference tracking objects within the tracking volume, an offset between the known position and orientation (in the global reference frame) and the Vive-measured relative position and orientation (in the Vive reference frame) can be determined and applied by the data-processing computer 170 to align the Vive system's reference frame with the physical global reference frame.

It should be understood by those of skill in the art that the foregoing steps can be similarly performed by other tracking systems incorporated into the calibration system 100, e.g., the G4-based magnetic tracking system 150, such that the positional measurements for all various tracked objects exist in the same global reference frame.

In addition, the initialization step 305 can also include the step of calibrating a rigid offset (e.g., a relative position and/or orientation) from the reference position object and magnetic sensor objects on the calibration device structure. The rigid offset is the offset vector between the Vive tracked object 130A, and the individual magnetic sensors 160A-160C. One way to track the virtual true positions of the magnetic sensors is to reference all the magnetic sensors found on the structure to the tracked object 130A. Preferably, the rigid offset never changes during the data collection process. This coupled with the fact the tracked object 130A is rigidly affixed to the calibration structure allows for the movement of the tracked object 130A to accurately represent the physical locations of the magnetic sensors attached to the calibration structure.

More specifically, calculating the rigid offset can include, but is not limited to, step (a), defining a location in the physical tracking volume as the "calibration origin." In particular, a point in space can be accepted as a calibration origin, meaning that when the calibration structure is place at a given point, the defined virtual points determined in the ensuing measuring step (b) will reference this point. Then, at step (b), the physical positions of the magnetic sensor objects from the known calibration origin is measured. As mentioned values defined during this step will assume the calibration structure is properly aligned and placed at the calibration origin defined in step a. For example, a calibration origin point of (0,0,1) is accepted and, by measuring from that point, one of the magnetic sensors is found to be at position (0,1,0), which would mean the particular magnetic sensor is globally at point (0,1,1). Accordingly, the sub-routine can also include the step (c) of placing and leveling the calibration device support structure so that the physical points are in line with the physical measurements from the calibration origin. This means the calibration structure is brought to the calibration origin and position in such a way the physical magnetic sensors reside in the same position as defined in part b, wherein "in line" means the sensor positions found in part b match that of the physical sensor position, once the calibration structure is in place.

After initialization, the Vive tracked object 130A and sensor objects 160A-160C are calibrated and mapping can begin. As noted and further described herein, the calibration-data collection or "mapping" process can involve the calibration device being moved around within the specified tracking volume and the data-processing computer recording calibration data-points measured by respective tracking systems at each of a plurality of locations within the tracking volume.

More specifically, at step 310 the calibration device is positioned at a location within the tracking volume. At step 315, magnetic sensor position readings are obtained for each of the magnetic sensors 160A-160C using the magnetic tracking system 150 and a corresponding "reference position" of the reference tracking object 130A is measured using the reference position tracking system 120. As can be appreciated, the measuring of position data using respective tracking systems can be coordinated and performed under the control of the data-processing computer 170.

Steps 310 and 315 can be repeated for any number of additional locations within the tracking space until a desired number of calibration data points are collected. In some implementations the desired number of reference positions can be defined by the user. In addition, or alternatively, the data-processing computer 170 can determine how many reference positions are sufficient for calibration. For instance, the data-processing computer can determine the number of data-points to be collected dynamically based on the desired accuracy of the magnetic measurements and the detection of steady-state magnetic distortions within the tracking volume from captured calibration data. Accordingly, it can be further appreciated that the data-processing system 170 can be further configured to guide the user through the calibration process by, inter alia, instructing the user where to capture calibration data readings within the tracking volume.

Figure 3B:
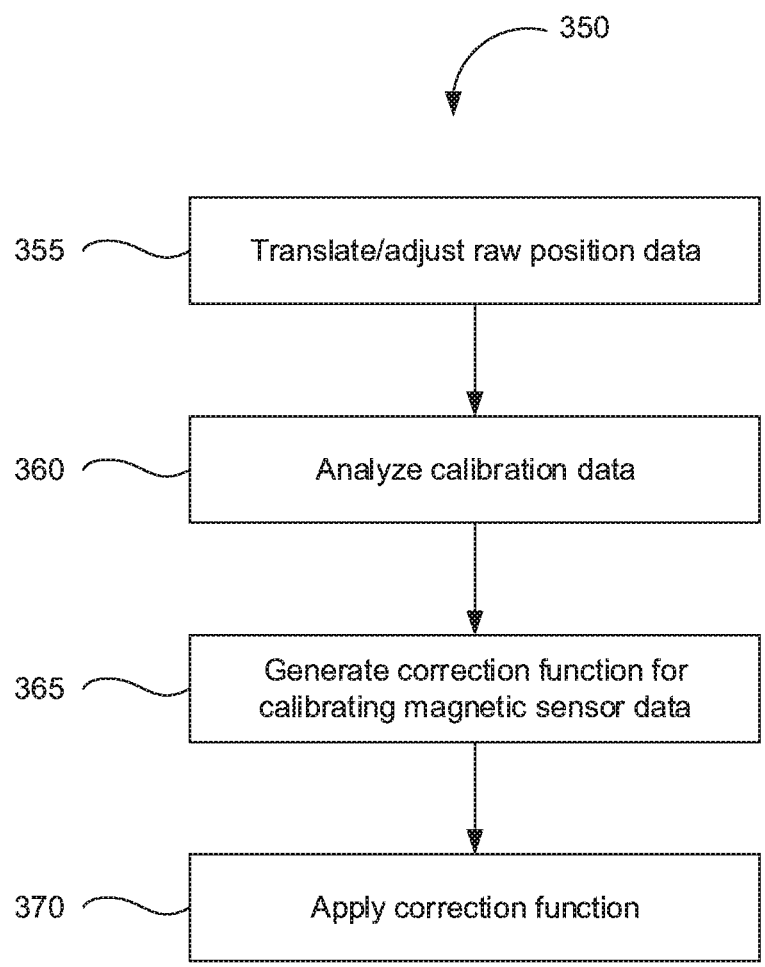
FIG. 3B is a flow chart of a method for calibrating electromagnetic tracking systems by processing collected location data according to one embodiment of the present invention.

At step 320, and as further described in connection with the data-processing routine 350 illustrated in FIG. 3B, the measured calibration data is processed to correct/calibrate the data measured using the magnetic tracking system. It should be understood that one or more of the steps for processing the captured calibration data can be performed during and/or after the aforementioned steps for recording the calibration data (e.g., steps 310 and 315). For instance, steps for translating or converting raw positional data captured using the Vive-based reference tracking system 120 into the global reference frame can be performed in connection with each data-measurement step, or thereafter.

At step 355, the data-processing computer executing the calibration software application can be configured to apply the aforementioned translation solution(s) to the raw position data captured using respective tracking systems. As a result, the calibration-data that can be recorded by the data-processing system at each point in which calibration data is collected using respective sensors exists in a common reference frame, preferably, the global physical reference frame, thereby facilitating further processing of the calibration-data. The calibration data measured using the plural sensors at a given location are collectively referred to as a "data point."

The calibration data for one or more calibration data-points captured using the magnetic tracking system 150 can be analyzed by the data-processing computer 170 according to the corresponding reference position data, step 360. More specifically, the data-processing computer, which is executing one or more modules of a calibration software application, can be configured to compare the magnetic sensor data captured by respective magnetic sensors at respective locations within the tracking volume to the "actual position" for the respective sensors. In particular, the actual physical location of a given magnetic sensor, can be determined from the position of the reference tracking object 130A, as measured using the reference tracking system 120, and the known relative physical position of the reference tracking object and the magnetic sensor, as determined during initialization and set-up. Accordingly, based on the comparison, the data-processing computer can identify location(s) within the tracking volume in which magnetic sensor measurements are distorted due to, for example, local steady state magnetic field distortions.

At step 365, the data-processing computer 170 is configured to generate a correction function that can be applied to adjust/correct distorted magnetic sensor measurement values to values that more accurately reflect the actual physical location of the respective magnetic sensor(s). As noted above, the actual physical location of a respective magnetic sensor can be determined from the measured position of the reference tracking object 130A and the known relative physical position of the reference tracking object and the magnetic sensor during the capture of the calibration data.

In some exemplary implementations, the data-processing computer 170 can be configured to use a Radial Basis Function, specifically Hardy's Multi-Quartic function, to apply a correction to the distorted magnetic sensor values such that they are adjusted to the actual physical locations. More specifically, this exemplary method can interpolate the entirety of the recorded space using the discrete number of reference points to solve the location of points within the environment. As would be understood, any defined volume has an infinite number of points found therein. As such, in order to determine the location of a magnetically tracked sensor from the recorded points, the measured position at runtime is interpolated from the recorded points. For clarity, "reference points" refers to the actual physical location of a respective magnetic sensor, which is determined from the "known relative physical position" of the reference tracking object 130A and the magnetic sensor during the capture of the calibration data and the phrase the "location of points" refers the location of a magnetic sensor(s) recorded at run time. The function has N number of coefficients where N is the total number of calibration points gathered. The constants are solved using orthogonal-triangular decomposition. These constants are the same as the coefficients mentioned in the previous sentence and the coefficients/constants act as the solution for the algorithm. Specifically, every map taken has a set of coefficients/constants that allow for correct interpolation of points. The interpolation function $f_a$ where a represents each axis computed, namely x, y, and z.

The interpolation function is set forth in Equation 1, where $C_i$ is a respective coefficient at i, R is a user defined parameter which, in this case, is specific to the Hardy's Multi-Quartic function, and $g_i$ is the selected radial basis function. In this case, a Hardy's Multi-Quartic Interpolation can be used. Importantly, this function iterates over every calibration point for each new point that needs to be interpolated.

$$f_a(x, y, z) = \sum_{i=1}^{N} C_i g_i(x, y, z) \qquad \text{Equation 1}$$

$$g_i(x, y, z) = \sqrt{(x-x_i)^2 + (y-y_i)^2 + (z-z_i)^2 + R^2}$$

In addition, the data-processing computer 170 can be configured to determine the constants for the foregoing interpolation function using, for example, LU (lower upper) decomposition. The foregoing is a non-limiting example of just one of many possible mathematical approaches to defining a correction function that can be applied to adjust/correct distorted magnetic sensor measurement values to values that more accurately reflect the actual physical location of the respective magnetic sensor(s).

At step 370, the data processing computer 170 can apply the correction function and/or output information relating to the completion of calibration and application of the correction function generated at step 365. For instance, in some implementations, the correction function can be stored in a memory by the data processing computer 170 and integrated into a live VR system implementation to correct magnetic sensor data in real-time using the magnetic tracking system 150 and thereby producing fully immersive VR experiences unhindered by steady state magnetic distortion. More specifically, the live VR system implementation can be configured to accept the position of a given magnetic sensor (e.g., x, y and z coordinates), pass these values through the correction function and publish the resulting output such that it can be used by the VR system's main rendering process to recognize objects and players while providing an immersive VR experience using the corrected/calibrated magnetic sensor position data.

By way of further example, implementation of the correction function at step 370 can include output of, by the data-processing computer in communication with an associated output-device, information relating to the location of steady-state magnetic field distortions in the tracking volume, the magnitude of such distortions and/or the corresponding adjustments made to the magnetic sensor data using the correction function.

As noted, testing results have shown that magnetic distortion correction systems and algorithms that keep the positional accuracy of a magnetic tracking system to within about eight (8) millimeters of the actual position are suitable for VR applications. Whereas existing magnetic distortion correction solutions offered by manufacturers of commercially available electromagnetic tracking systems fail to achieve sufficient accuracy for room-scale VR systems, the exemplary calibration systems and magnetic distortion correction algorithms disclosed herein achieve the requisite accuracy, or better, thereby allowing for existing magnetic tracking systems to be effectively used in room-scale VR systems.

Figure 5:
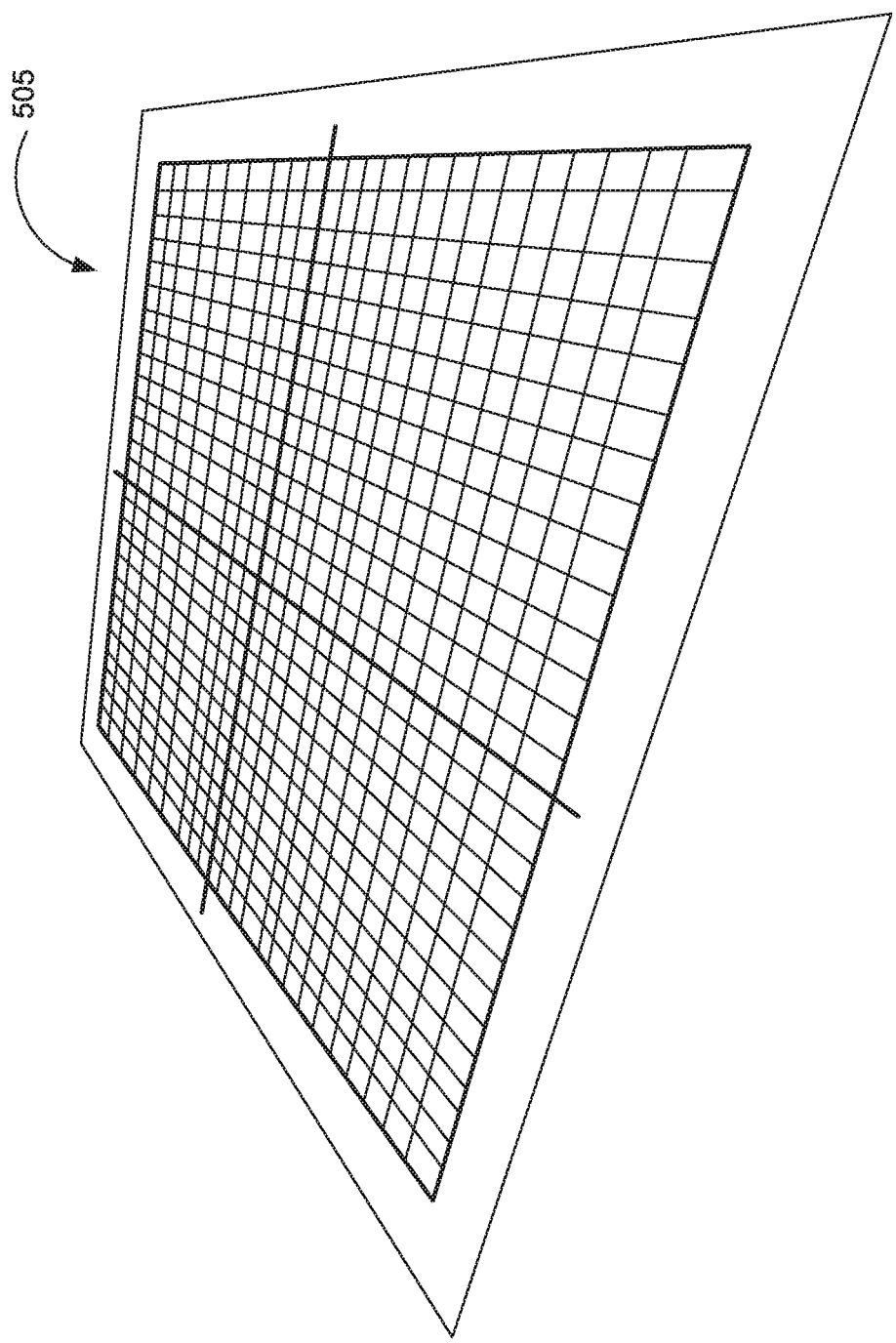
FIG. 5 is a diagram illustrating a grid for calibrating magnetic sensor systems, as is known in the prior art.

According to a further salient aspect, the exemplary calibration systems and methods enable the measurement of calibration data more efficiently than existing systems and with a higher degree of accuracy. As noted, existing calibration data collection methods can involve laying out a measured grid with holes drilled or markers set at known intervals (as shown for example as grid 505 in FIG. 5), to provide the known physical reference positions at which magnetic sensor data is captured, manually positioning vertically spaced apart magnetic sensors at each reference position within the grid and measuring the magnetic sensor data for respective reference position. Constructing a room-sized floor grid shown in FIG. 5 and recording magnetic calibration data consumes a significant amount of time (e.g., 45 man-hours to construct a grid and 10 man-hours for sensor data collection) and can be prone to error arising from the manual construction of the reference grid, as well as the manual positioning/leveling of the calibration device during data-collection. By comparison, the calibration data-collection process using exemplary calibration systems and methods described herein for the same space take a significantly shorter amount of time.

Figure 4A:
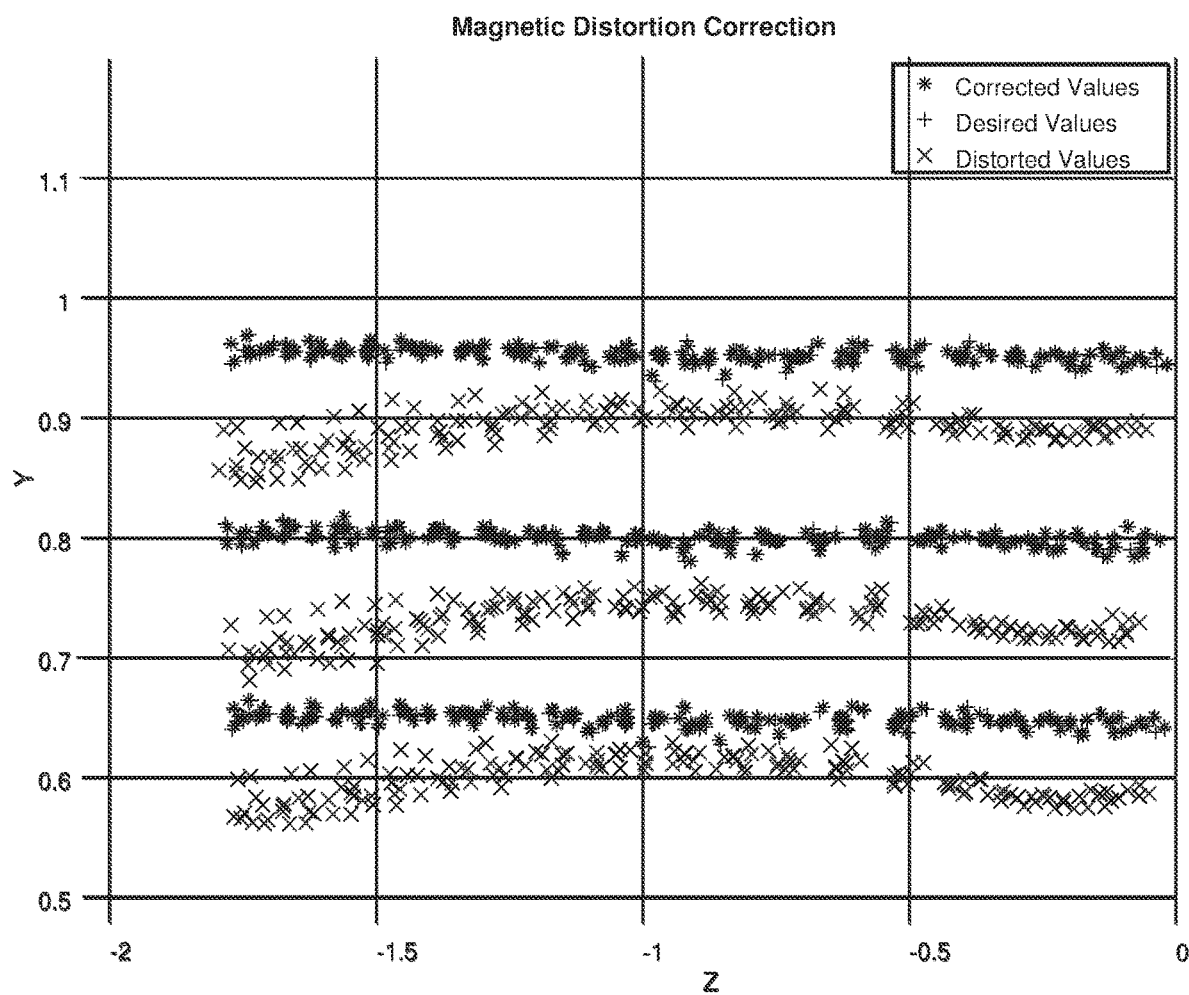
FIG. 4A is a visualization of calibration data and processed data along a given axis according to one embodiment of the present invention.
Figure 4B:
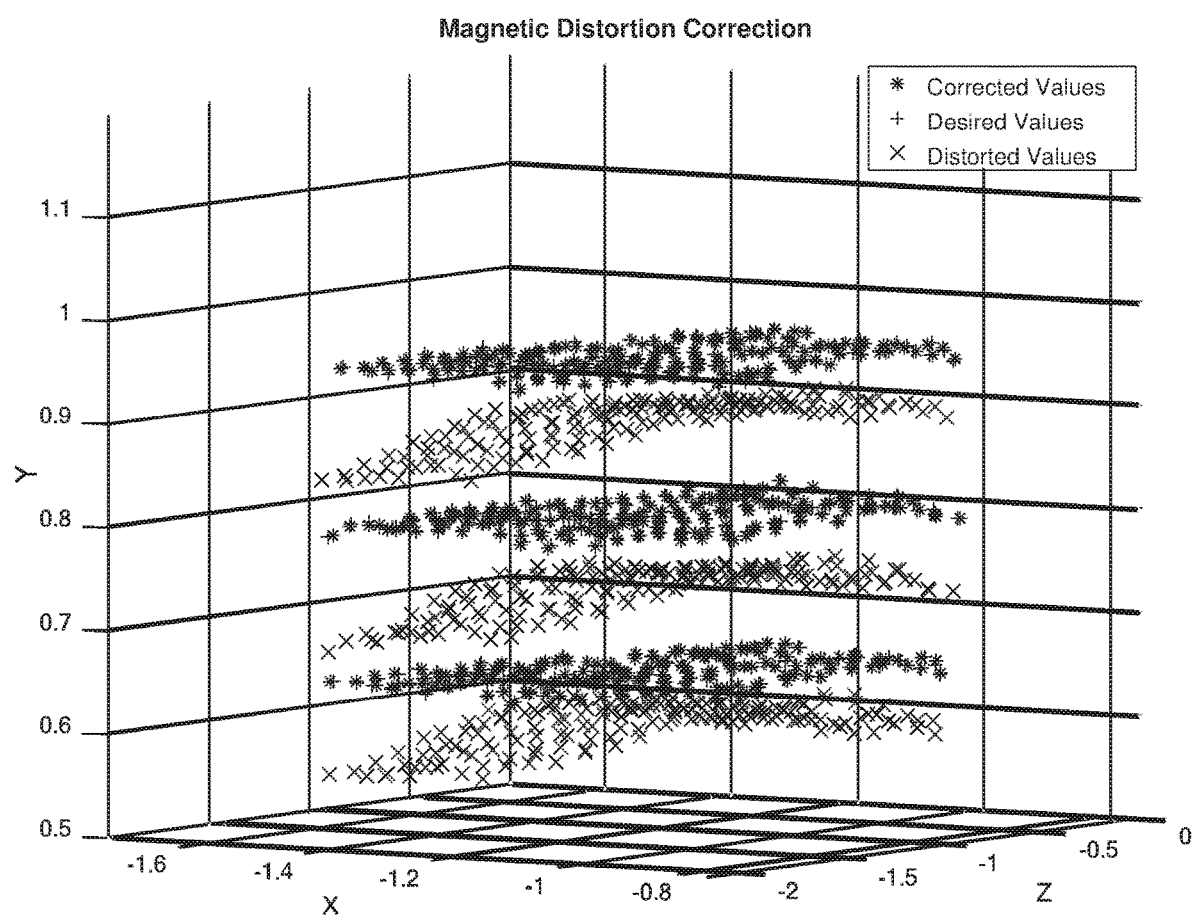
FIG. 4B is a visualization of calibration data and processed data along an alternative axis according to an embodiment of the present invention.

More specifically, in the exemplary comparative test, calibration data points were taken using the exemplary calibration device 140 that was moved roughly along the lines of the grid (e.g., grid 505 in FIG. 5), and calibration data points were gathered at estimate intervals. In practice, it took approximately an hour to gather 6240 individual points. FIGS. 4A-4B illustrate graphs depicting the data points collected within the three-dimensional tracking volume from a top-view and side-view of the volume, respectively.

In the graphs of FIGS. 4A and 4B, the "+" points correspond to the physical locations of the sensors determined by the reference tracking system 120, the "×" points show the distorted positions measured using the magnetic sensor system 150 and the "*" points correspond to the corrected positions generated using the system 100 applying the correction function. In addition, comparison of the position data collected using the disclosed calibration system to the data collected using the aforementioned manual calibration data collection process showed that over 85.9% of the adjusted magnetic sensor position readings generated using the exemplary calibration system and methods, were within a tolerance of +/−10 mm of the positions measured using the aforementioned manual collection/calibration method. However, it should be noted that the comparison does not take into account possible error in recording the data using the manual method. Furthermore, the X-direction Error Standard Deviation was found to be 4.70 mm; the Y-direction Error Standard Deviation was found to be 2.52 mm and the Z-direction Error Standard Deviation was found to be 5.53 mm.

Ultimately, the results from using the calibration system 100 disclosed herein are well within the desired tolerance of +/−10 mm for about 85.9 percent of the data points tested. The exemplary calibration data collection systems and methods disclosed herein also perform comparable to, if not better than, manual data collection methods that take considerably more time to accomplish. Furthermore, the overall system tolerance utilizing the exemplary calibration system 100 incorporating a reference-position tracked object on the calibration device (e.g., object 130A on the device 140) is more accurate than that of the manual data collection method allowing for better overall results.

Figure 6:
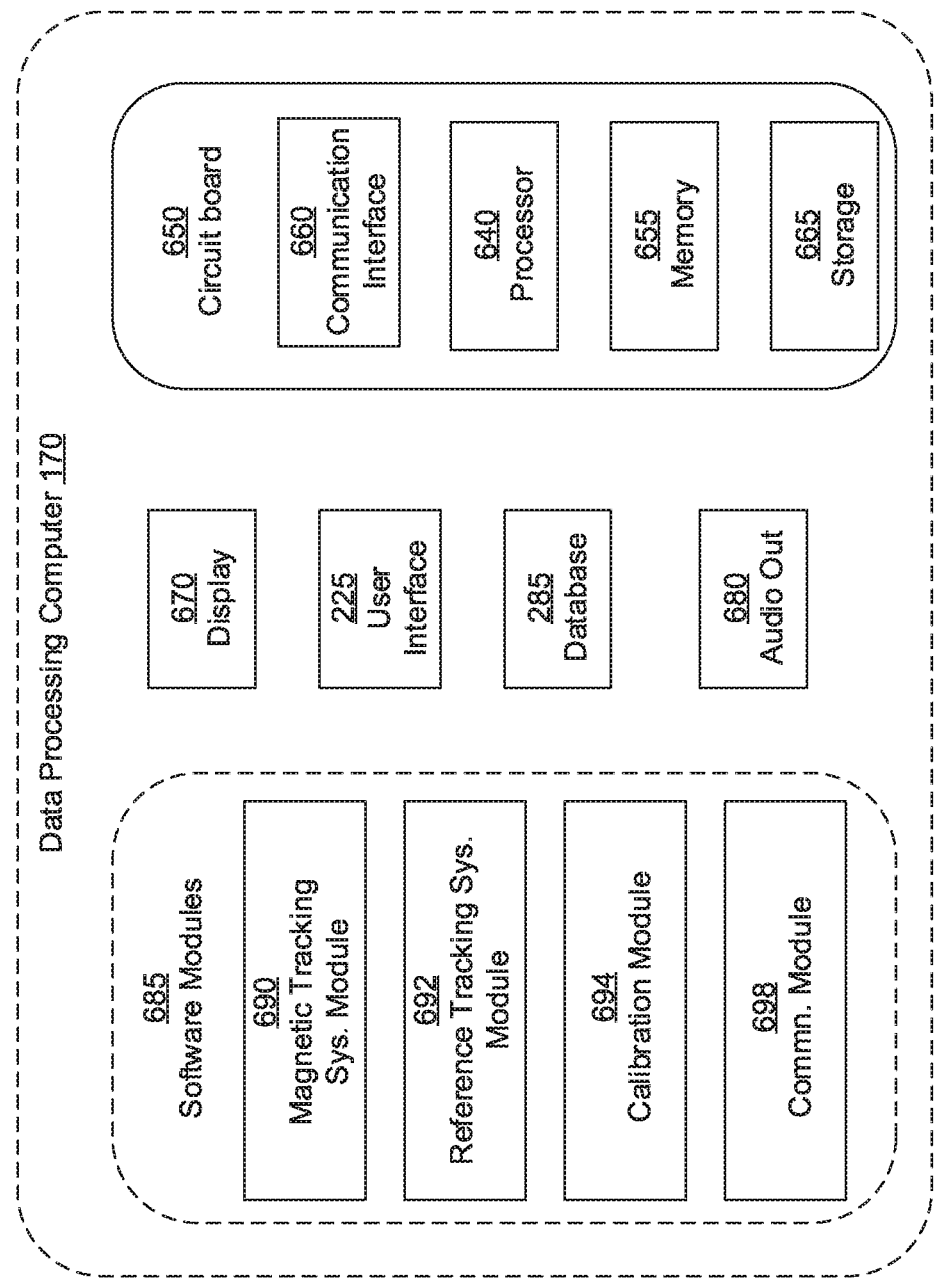
FIG. 6 is a block diagram illustrating exemplary hardware and software components of a data-processing device according to one embodiment of the present invention.

FIG. 6 is a block diagram illustrating an exemplary configuration of hardware and software components of one or more of the computing devices (e.g., the data-processing computer 170 described in the present disclosure as performing the various operations relating to the calibration of the magnetic tracking system).

Components of the computing devices include a processor 640 and a circuit board 650. The circuit board can include a memory 655, a communication interface 660 and a computer readable storage medium 665 that are accessible by the processor 640. The board 650 can also include or be coupled to a power source (not shown) source for powering the computing device.

The processor 640 and/or circuit board 650 can also be coupled to a display 670, for visually outputting information to an operator (user), a user interface 675 for receiving operator inputs, and an audio output 680 for providing audio feedback as would be understood by those in the art. As an example, the processor 640 could emit a visual signal from the display 670, for instance, the graphical image of the data collected using the system 100. Although the various components are depicted either independent from, or part of the circuit board 650, it can be appreciated that the components can be arranged in various configurations.

The processor 640 serves to execute software instructions that can be loaded into the memory. The processor 640 can be implemented using multiple processors, a multi-processor core, or some other type of processor. The memory 655 is accessible by the processor 640, thereby enabling the processor to receive and execute instructions stored on the memory and/or on the storage. Memory 655 can be implemented using, for example, a random access memory (RAM) or any other suitable volatile or non-volatile computer readable storage medium. In addition, memory 655 can be fixed or removable.

The storage medium 665 can also take various forms, depending on the particular implementation. For example, storage medium 665 can contain one or more components or devices such as a hard drive, a flash memory, a rewritable optical disk, a rewritable magnetic tape, or some combination of the above. The storage medium 665 also can be fixed or removable or remote such as cloud based data storage systems (remote memory or storage configuration not shown). The storage, for example, can be used to maintain the database 285, which stores information relating to the calibration data collection or other information and or data used or generated while carrying out operations and implementing aspects of the systems and methods disclosed herein.

One or more software modules 685 are encoded in the memory 655 and/or storage medium 665. The software modules can comprise one or more software programs or applications having computer program code or a set of instructions executed in the processor 640. Such computer program code or instructions for carrying out operations and implementing aspects of the systems and methods disclosed herein can be written in any combination of one or more programming languages. While software modules are stored locally in storage 665 or memory 655 and execute locally in the processor 640, the processor can interact with remotely-based computing platform via communication interface 660 and via a local or wide area network to perform calculations or analysis.

During execution of the software modules 685, the processor 640 is configured to perform the various operations of the system for collecting position data from magnetic and other tracking systems, and calibrating the collected magnetic position data for use in VR applications. The software modules can include code for implementing the aforementioned steps and other steps and actions described herein, for example and without limitation: a magnetic tracking system module 690, which configures the processor to control and operate the magnetic tracking system and collect magnetic sensor positional data therewith; a reference tracking system module 692, which configures the processor to control and operate the magnetic tracking system and collect magnetic sensor positional data therewith as well perform various operations relating to calibration of the reference position tracking system; a calibration module 694, which configures the processor to perform various processes relating to the collection of calibration data using the magnetic and reference tracking system and the calibration of magnetic sensor data based on the calibration data; and a communication module 698, which configures the processor to communicate with remote devices (e.g., the tracking systems 120 and 150) over a communication connection (not shown) such as a communication network or any wired or wireless electronic communication connection.

The program code of the software modules 685 and one or more of the non-transitory computer readable storage devices (such as the memory 655 and/or the storage 665) can form a computer program product that can be manufactured and/or distributed in accordance with the present disclosure, as is known to those of ordinary skill in the art.

Illustrative embodiments and arrangements of the present systems and methods provide a system and a computer implemented method, computer system, and computer program product for the calibration of a magnetic tracking system. The flowchart and block diagrams in the figures illustrate the architecture, functionality, and operation of possible implementations of systems, methods and computer program products according to various embodiments and arrangements. In this regard, each block in the flowchart or block diagrams can represent a module, segment, or portion of code, which comprises one or more executable instructions for implementing the specified logical function(s). It should also be noted that, in some alternative implementations, the functions noted in the block can occur out of the order noted in the figures. For example, two blocks shown in succession can, in fact, be executed substantially concurrently, or the blocks can sometimes be executed in the reverse order, or one or more of the blocks can be repeated, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It is to be understood that any structural and functional details disclosed herein are not to be interpreted as limiting the systems and methods, but rather are provided as a representative embodiment and/or arrangement for teaching one skilled in the art one or more ways to implement the methods.

It should be understood that although much of the foregoing description has been directed to systems and methods for calibrating magnetic sensor systems used in room-scale immersive VR systems, the systems methods disclosed herein can be similarly deployed in scenarios, situations, and settings beyond the referenced scenarios. For example, magnetic tracking systems for use in smaller scale settings or even non-VR applications can be calibrated using the exemplary systems and methods described herein. It should be further understood that any such implementation and/or deployment is within the scope of the system and methods described herein.

It is to be further understood that like numerals in the drawings represent like elements through the several figures, and that not all components and/or steps described and illustrated with reference to the figures are required for all embodiments or arrangements The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof.

Terms of orientation are used herein merely for purposes of convention and referencing, and are not to be construed as limiting. However, it is recognized these terms could be used with reference to a viewer. Accordingly, no limitations are implied or to be inferred.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

While the invention has been described with reference to exemplary embodiments, it will be understood by those skilled in the art that various changes can be made and equivalents can be substituted for elements thereof without departing from the scope of the invention. In addition, many modifications will be appreciated by those skilled in the art to adapt a particular instrument, situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method for calibrating an electromagnetic position tracking system (EPTS) within a three-dimensional space, comprising:
    providing a calibration system that includes:
        the EPTS that includes an electromagnetic field transmitter configured to transmit an electromagnetic field through the three-dimensional space, and one or more magnetic sensor objects configured to detect the transmitted electromagnetic fields, wherein the EPTS is in data communication with a data processing computer and configured to measure a magnetic sensor object position (MSO position) of a given one of the one or more magnetic sensor objects as a function of the transmitted electromagnetic field detected by the given one of the one or more magnetic sensor objects,
        a reference position tracking system (RPTS) that includes a reference tracked object and one or more base stations, wherein the RPTS is in data communication with the data processing computer and configured to measure a reference position of the reference tracked object within the three-dimensional space using an object tracking technology that is not affected by steady state magnetic field distortions local to the three-dimensional space, and
        a sensor support device including a support structure for supporting the reference tracked object and the given one of the one or more magnetic sensor objects and maintaining the reference tracked object and the given one of the one or more magnetic sensor objects in a known relative position; and
    measuring calibration data for a plurality of locations of the sensor support device supporting the reference tracked object and the given one of the one or more magnetic sensor objects within the three-dimensional space at the plurality of locations within the three-dimensional space, and for each location among the plurality of locations within the three-dimensional space of the sensor support device:
        measuring a value of the MSO position (MSO position value) for the given one of the one or more magnetic sensor objects using the EPTS and measuring a value of the reference position (reference position value) for the reference tracked object using the RPTS, and wherein the calibration data comprises the MSO position value measured for the given one of the one or more magnetic sensor objects using the EPTS and the reference position value measured for the reference tracked object using the RPTS and wherein the calibration data is stored by the data processing computer in an associated non-transitory storage medium,
        calculating a value of an actual position (actual position value] for the given one of the one or more magnetic sensor objects as a function of the reference position value and the known relative position, and
        generating, with the data processing computer based on the calibration data and the calculated actual position value, a correction function for converting one or more subsequently measured MSO position values for the given one of the one or more magnetic sensor objects into an adjusted MSO position value that accurately reflects an actual position of the given one of the one or more magnetic sensor objects and thereby compensating for position measurement errors caused by local steady state magnetic field distortions at any location within the three-dimensional space.

2. The method of claim 1, wherein the sensor support device further comprises an alignment sensor provided on the sensor support structure, and wherein the step of iteratively positioning the sensor support device includes aligning the sensor support structure in one or more directions using the alignment sensor.

3. The method of claim 1, wherein the correction function is configured to solve for a respective adjusted MSO position value that accurately reflects a respective actual position from the one or more subsequently measured MSO position values measured at any location within the three-dimensional space by interpolating an entirety of the three-dimensional space from the calibration data measured at the plurality of locations within the three-dimensional space.

4. The method of claim 1, further comprising, prior to the step of measuring calibration data:
    affixing the given one of the one or more magnetic sensor objects and reference tracked object to the sensor support device; and
    physically measuring the known relative position of the reference tracked object to the given one of the one or more magnetic sensor objects, wherein the known relative position is stored by the data processing computer in the storage medium.

5. The method of claim 1, further comprising, prior to the step of measuring the calibration data:
    aligning a native reference frame of the RPTS with a global physical reference frame that corresponds to the three-dimensional space; and
    wherein the data processing computer is configured to store the calibration data in accordance with the global physical reference frame.

6. The method of claim 5, wherein the step of aligning the native reference frame with the global physical reference frame comprises:
    providing the reference tracked object at a location within the three-dimensional space at a known relative physical position and orientation to a second reference tracked object, wherein the reference tracked object is a reference for an origin and the second reference tracked object is an orientation reference;

measuring a relative position and orientation of the reference tracked object to the second reference tracked object using the RPTS; and generating, with the data processing system as a function of the known and measured relative position and orientation of the reference tracked object and the second reference tracked object, a translation solution for converting the reference position value measured using the RPTS according to the native reference frame to the global physical reference frame, wherein the global physical reference frame is used for subsequent computations.

7. The method of claim 1, wherein the MSO position value measured for the given one of the one or more magnetic sensor objects using the EPTS includes one or more values for a location of the given one of the one or more magnetic sensor objects within the three-dimensional space in three-dimensions and an orientation value.

8. The method of claim 1, wherein the EPTS is a six (6) "degree of freedom" (DoF) electromagnetic tracking system and wherein the RPTS is a laser-based, line-of-sight object tracking system.

9. The method of claim 2, wherein the alignment sensor is a digital leveling device.

10. The method of claim 1, wherein a given one of the one or more magnetic sensor objects and the reference tracked object are linearly aligned along a length of the sensor support device.

11. A system for calibrating an electromagnetic position tracking system (EPTS), wherein the EPTS is used to track a position of one or more magnetic sensor objects within a three-dimensional space, comprising:

the EPTS that includes:
an electromagnetic field transmitter configured to transmit electromagnetic fields through the three-dimensional space, and
a given one of the one or more magnetic sensor objects configured to detect the electromagnetic fields,
wherein the EPTS is configured to measure a magnetic sensor object position (MSO position) of the given one of the one or more magnetic sensor objects as a function of the electromagnetic fields detected by the given one of the one or more magnetic sensor objects,
a reference position tracking system (RPTS) that includes:
a reference tracked object and one or more base stations, wherein the RPTS is configured to measure a reference position of the reference tracked object within the three-dimensional space using an object tracking technology that is not affected by steady state magnetic field distortions local to the three-dimensional space:
a sensor support device including a support structure for supporting the reference tracked object and the given one of the one or more magnetic sensor objects and maintaining the reference tracked object and the given one of the one or more magnetic sensor objects in a known relative position;
a data processing computer in data communication with the EPTS and RPTS, the data processing computer comprising:
a computer readable storage medium;
a communication interface,
a processor in operative communication with the communication interface, the storage medium, and
a calibration software application stored on the storage medium and executable by the processor, wherein the calibration software application configures the data processing computer to coordinate operation the RPTS and EPTS and calibrate the EPTS by:

for each of a plurality of locations within the three-dimensional space of the sensor support device supporting the reference tracked object and the given one of the one or more magnetic sensor objects, measuring a value of the MSO position (MSO position value) for the given one of the one or more magnetic sensor objects using the EPTS and measuring a value of the reference position (reference position value) for the reference tracked object using the RPTS, wherein the measured MSO position value for the given one of the one or more magnetic sensor objects and the measured reference position value for the reference tracked object for each of the plurality of locations are stored as calibration data in the storage medium, calculating, for each of the plurality of locations, a value of an actual position (actual position value) for the given one of the one or more magnetic sensor objects as a function of the measured reference position value and the known relative position, and generating, based on the calibration data measured at each of the plurality of locations and the actual position value calculated for each of the plurality of locations, a correction function for converting subsequently measured MSO position values for the given one of the one or more magnetic sensor objects into an adjusted MSO position value that accurately reflects an actual position of the given one of the one or more magnetic sensor objects and thereby compensating for EPTS position measurement errors caused by local steady state magnetic field distortions at any location within the three-dimensional space.

12. The system of claim 11, wherein the sensor support device further comprises an alignment sensor provided on the sensor support structure, and wherein the alignment sensor is useable to align the sensor support structure in one or more directions prior to measuring a position value for the given one of the one or more magnetic sensor objects using the EPTS and measuring the reference position value for the reference tracked object using the RPTS.

13. The system of claim 12, wherein the alignment sensor is a digital leveling device.

14. The system of claim 11, wherein the correction function is configured to solve for the actual position from the measured MSO position value measured at any location within the three-dimensional space by interpolating from calibration data measured at a discrete number of locations within the three-dimensional space.

15. The system of claim 11, wherein the given one of the one or more magnetic sensor objects and reference tracked object are removably attached to the sensor support device at the known relative position.

16. The system of claim 11, wherein the data processing computer is configured to align a native reference frame of the RPTS with a global physical reference frame that corresponds to the three-dimensional space, and wherein the data processing computer is further configured to store the calibration data in accordance with the global physical reference frame.

17. The system of claim 16, wherein the data processing computer is configured to align the native reference frame with the global physical reference frame by:

measuring a relative position and orientation of the reference tracked object to a second reference tracked object using the RPTS, wherein the reference tracked object is provided at a location within the three-dimensional space at a known relative physical position and orientation to the second reference tracked object, wherein the reference tracked object is a reference for an origin and the second reference tracked object is an orientation reference; and generating, as a function of the known and measured relative position and orientation of the reference track object and the second reference tracked object, a translation solution for converting position values measured using the RPTS according to the native reference frame to the global physical reference frame, wherein the global physical reference frame is used for subsequent computations.

18. The system of claim 11, wherein the MSO position value measured for the given one of the one or more magnetic sensor objects using the EPTS includes one or more values for a location of the given one of the one or more magnetic sensor objects within the three-dimensional space in three-dimensions and an orientation value.

19. The system of claim 11, wherein the EPTS is a six (6) "degree of freedom" (DoF) electromagnetic tracking system and wherein the RPTS is a laser-based, line-of-sight object tracking system.

20. The system of claim 11, wherein the given one of the magnetic sensor objects are provided on the sensor support device at respective known relative positions relative to the reference tracked object, and wherein calibration data is measured using the given one of the magnetic sensors objects.

21. The system of claim 20, wherein the given one of the magnetic sensor objects and the reference tracked object are linearly aligned along a length of the sensor support device.

* * * * *